United States Patent
Sorg et al.

(10) Patent No.: US 9,488,344 B2
(45) Date of Patent: Nov. 8, 2016

(54) METHOD FOR PRODUCING A LIGHTING DEVICE AND LIGHTING DEVICE

(75) Inventors: Joerg Sorg, Regensburg (DE); Ralph Wirth, Lappersdorf (DE)

(73) Assignee: OSRAM GMBH, Munich (DE)

( * ) Notice: Subject to any disclaimer, the term of this patent is extended or adjusted under 35 U.S.C. 154(b) by 239 days.

(21) Appl. No.: 14/125,356

(22) PCT Filed: Jun. 12, 2012

(86) PCT No.: PCT/EP2012/061066
§ 371 (c)(1),
(2), (4) Date: Dec. 11, 2013

(87) PCT Pub. No.: WO2013/004455
PCT Pub. Date: Jan. 10, 2013

(65) Prior Publication Data
US 2015/0036343 A1  Feb. 5, 2015

(30) Foreign Application Priority Data
Jun. 16, 2011  (DE) .................. 10 2011 077 614

(51) Int. Cl.
| | |
|---|---|
| *F21S 4/00* | (2016.01) |
| *F21V 21/00* | (2006.01) |
| *F21V 19/00* | (2006.01) |
| *F21K 99/00* | (2016.01) |
| *H01L 25/075* | (2006.01) |

(Continued)

(52) U.S. Cl.
CPC ............. *F21V 19/0015* (2013.01); *F21K 9/30* (2013.01); *F21K 9/90* (2013.01); *F21Y 2101/02* (2013.01); *F21Y 2101/025* (2013.01); *F21Y 2105/001* (2013.01); *H01L 25/0753* (2013.01); *H01L 2224/48091* (2013.01); *Y10T 29/4913* (2015.01)

(58) Field of Classification Search
CPC ........ F21V 19/0015; F21K 9/30; F21K 9/90; H01L 25/0753; H01L 2224/48091; F21Y 2101/02; F21Y 2105/001; F21Y 2101/025
USPC .............. 362/382, 368, 249.01, 249.02, 612, 362/225, 217.14, 217.16; 29/832, 834, 835
See application file for complete search history.

(56) References Cited

U.S. PATENT DOCUMENTS

| | | |
|---|---|---|
| 5,043,796 A | 8/1991 | Lester |
| 7,087,463 B2 | 8/2006 | Sackrison et al. |

(Continued)

FOREIGN PATENT DOCUMENTS

| | | |
|---|---|---|
| CN | 1470072 A | 1/2004 |
| CN | 101128932 A | 2/2008 |

(Continued)

OTHER PUBLICATIONS

Machine English Translation of DE19821544A1 Dec. 16, 1999.*

(Continued)

*Primary Examiner* — Anh Mai
*Assistant Examiner* — Glenn Zimmerman
(74) *Attorney, Agent, or Firm* — Viering,Jentschura&Partner mbB (57) ABSTRACT

A method for producing a lighting device may include: providing a first mount, fastening a second mount to the first mount, at least partially severing the second mount into at least two parts after fastening of the second mount to the first mount, and fastening at least two luminescence diode chips to that side of the second mount which is remote from the first mount.

17 Claims, 5 Drawing Sheets

(51) Int. Cl.
*F21Y 101/02* (2006.01)
*F21Y 105/00* (2016.01)

(56) References Cited

U.S. PATENT DOCUMENTS

| | | | |
|---|---|---|---|
| 8,154,031 | B2 | 4/2012 | Groetsch et al. |
| 2002/0176251 | A1* | 11/2002 | Plank .................. A61C 19/003 362/241 |
| 2003/0178627 | A1 | 9/2003 | Marchl et al. |
| 2006/0091524 | A1* | 5/2006 | Karashima ............ H01L 21/486 257/700 |
| 2007/0080360 | A1* | 4/2007 | Mirsky ............... H01L 23/3677 257/99 |
| 2007/0085093 | A1* | 4/2007 | Ohmae ................... C30B 23/04 257/89 |
| 2007/0248132 | A1* | 10/2007 | Kikuchi ................ B82Y 20/00 372/44.01 |
| 2008/0198593 | A1 | 8/2008 | Breinich et al. |
| 2008/0303038 | A1* | 12/2008 | Grotsch .............. H01L 25/0753 257/88 |
| 2009/0052178 | A1 | 2/2009 | Marchl et al. |
| 2009/0078455 | A1 | 3/2009 | Takakusaki et al. |
| 2010/0025722 | A1* | 2/2010 | Wada ................... H01L 33/486 257/99 |
| 2011/0007762 | A1 | 1/2011 | Fukuda et al. |
| 2011/0095311 | A1 | 4/2011 | Marchl et al. |
| 2011/0127912 | A1 | 6/2011 | Lee et al. |
| 2012/0087385 | A1* | 4/2012 | Oakes ........................ F41J 2/02 372/34 |
| 2012/0134154 | A1 | 5/2012 | Marchl et al. |

FOREIGN PATENT DOCUMENTS

| | | | |
|---|---|---|---|
| CN | 102057506 | A | 5/2011 |
| DE | 19609929 | A1 | 9/1997 |
| DE | 19821544 | A1 | 12/1999 |
| DE | 102005009060 | A1 | 9/2006 |
| DE | 102008041690 | A1 | 3/2010 |
| EP | 2280428 | A1 | 2/2011 |
| JP | S63132495 | A | 6/1988 |
| JP | 11346031 | A | 12/1999 |
| JP | 2004512687 | A | 4/2004 |
| JP | 2004266235 | A | 9/2004 |
| JP | 2004311791 | A | 11/2004 |
| JP | 2006294898 | A | 10/2006 |
| JP | 2007194383 | A | 8/2007 |
| JP | 2007529177 | A | 10/2007 |
| JP | 2008103761 | A | 5/2008 |
| JP | 2008186914 | A | 8/2008 |
| JP | 2009081196 | A | 4/2009 |
| JP | 2009267066 | A | 11/2009 |
| JP | 2010272736 | A | 12/2010 |
| JP | 2011119732 | A | 6/2011 |
| WO | 0108219 | A1 | 2/2001 |
| WO | 0126153 | A1 | 4/2001 |
| WO | 0233756 | A1 | 4/2002 |
| WO | 2009113180 | A1 | 9/2009 |

OTHER PUBLICATIONS

English language abstract of DE 19821544 A1 of Dec. 16, 1999.
English language abstract of DE 102008041690 A1 of Mar. 4, 2010.
English language abstract of DE 19609929 A1 of Sep. 18, 1997.
International Search Report issued in the corresponding PCT application No. PCT/EP2012/061066, dated Oct. 12, 2012, 12pages.
Office Action issued in the corresponding German application No. 102011077614.1, dated Feb. 27, 2012.
Dehmel, A. et al., Direct Copper Bonded Ceramic Substrates for Use with Power LEDS, Electronic Packaging Technology, 2007, 6 pages.
Japanese Office Action based on Application No. 2014-515153 (2 pages of English translation) dated Aug. 17, 2015.
Chinese Office Action based on Application No. 201280027077.7 (8 Pages and 7 Pages of English translation) dated Sep. 28, 2015.

* cited by examiner

METHOD FOR PRODUCING A LIGHTING DEVICE AND LIGHTING DEVICE

RELATED APPLICATIONS

This application is a national stage entry according to 35 U.S.C. §371 of PCT application No.: PCT/EP2012/061066 filed on Jun. 12, 2012, which claims priority from German application No.: 102011077614.1 filed on Jun. 16, 2011.

TECHNICAL FIELD

A method for producing a lighting device and a lighting device are specified.

BACKGROUND

A problem addressed consists in specifying a method for producing a lighting device which is particularly stable on aging. In particular, the lighting device produced by means of the method is particularly robust with respect to thermomechanical alternating stresses.

SUMMARY

In accordance with at least one embodiment of the method, the method includes a method step in which a first mount is provided. The first mount is designed to mechanically support components of the lighting device to be produced. Furthermore, the first mount is characterized in particular by particularly good thermal conductivity. For example, the first mount can in this case be designed to be electrically conductive. In particular, the first mount is then a metallic mount, which is formed with a metal such as copper, for example. The first mount can then absorb heat generated by components of the lighting device during operation and emit it to the outside particularly well. This means that the first mount forms in particular a heat sink of the lighting device.

In accordance with at least one embodiment of the method, a second mount is fastened on the first mount. For example, the second mount is fastened on a main area of the first mount. The fastening of the second mount is performed, for example, by means of a connecting means which, in addition to a mechanical connection between the first mount and the second mount, also produces a thermal connection between the first mount and the second mount. This means that the connecting means can be characterized by good thermal conductivity.

The second mount is a mount which is designed to accommodate and mechanically support some of the components of the lighting device on its side remote from the first mount. The second mount in this case has in particular a smaller basic area than the first mount. The second mount is likewise characterized by good thermal conductivity. In this case, the second mount can in particular be designed to be electrically insulating. For example, the second mount is formed with an undoped semiconductor material or a ceramic material. This means that the second mount can be in particular a ceramic mount. For example, the second mount is formed with AlN, which is characterized by a coefficient of thermal conductivity of approximately 180 W/mK.

In accordance with at least one embodiment of the method, the second mount is at least partially severed into at least two parts after the fastening of the second mount on the first mount. The second mount can be split in such a way that the material of the second mount does not impart any connection between the parts of the second mount which are produced by the severing. The parts of the second mount which are produced by the severing are held in a fixed position relative to one another and relative to the first mount mechanically, for example, only by virtue of their connection to the first mount, with this position remaining unchanged by the severing of the second mount. That is to say that complete severing can take place.

Furthermore, it is possible for partial severing of the second mount to take place. In this case, a trench is introduced into the second mount, which trench acts as a desired breaking point between the parts of the second mount. During operation of the lighting device, the first mount is subject to greater thermal expansion than the second mount, and complete severing of the second mount can take place along the desired breaking point. The penetration depth of the trench into the second mount from the side remote from the first mount is in this case at least 5%, in particular at least 10% of the average thickness of the second mount. In this way, it is possible to ensure that complete severing along the desired breaking point can take place during operation.

The separating lines between parts of the second mount in this case run transversely, in particular perpendicular to the upper side of the first mount which faces the second mount. That is to say that the basic area of the parts of the second mount is smaller than the basic area of the second mount.

In accordance with at least one embodiment of the method, at least two luminescence diode chips are fastened on that side of the second mount which is remote from the first mount. In this case, the luminescence diode chips can be connected in particular mechanically fixedly to the second mount and are connected thereto with good thermal conductivity.

The luminescence diode chips are, for example, light-emitting diode chips or laser diode chips which generate electromagnetic radiation, in particular light, during operation. In this way, electromagnetic radiation, in particular light, can likewise be emitted by the lighting device during operation. In particular, it is possible for the luminescence diode chips to emit white and/or colored light. For the case where the luminescence diode chips are designed for emitting white light, they include, for example, a luminescence conversion material, which is designed for down-conversion of electromagnetic radiation.

In accordance with at least one embodiment of the method for producing a lighting device, the method includes the following steps:
 providing a first mount,
 fastening a second mount to the first mount,
 at least partially severing the second mount into at least two parts after fastening of the second mount to the first mount, and
 fastening at least two luminescence diode chips to that side of the second mount which is remote from the first mount.

In this case, the method may be implemented in particular in the sequence in which the individual method steps are listed.

In accordance with at least one embodiment of the method, at least two of the luminescence diode chips are fitted on different parts of the second mount. That is to say that a first part of the second mount supports, for example, a first luminescence diode chip of the lighting device and a second part of the mount supports a second luminescence diode chip of the lighting device. These two luminescence diode chips are then not connected to one another by the second mount either mechanically, electrically or thermally. A mechanical connection between the two luminescence diode chips on different parts of the second mount is then only or primarily provided by the first mount.

The method described here is based, inter alia, on the following considerations:

Good thermal connection of luminescence diode chips is advantageous in order to dissipate the heat produced in the luminescence diode chip by the electrical power loss. For example, the brightness of luminescence diode chips is a function of the temperature. As the temperature increases, the brightness and efficiency of the luminescence diode chips decrease. Furthermore, low operating temperatures have a favorable effect on the life of the luminescence diode chip since most aging processes are temperature-activated. Therefore, good thermal management makes a contribution to the achievement of a high degree of efficiency and enables the implementation of long lives.

The possibility of making electrical contact with the mounting face of the luminescence diode chip is a further important aspect. The luminescence diode chip is mounted with its mounting face on a heat sink. The heat sink is for its part again fitted in a housing. The luminescence diode chip rear side has an electrical potential, and the housing should be potential-free. Therefore, it has been identified by the inventors that an electrical insulation plane may be advantageous between the mounting face of the luminescence diode chip and the housing.

In particular metal materials are used as the heat sink and as the housing material. These metal materials are characterized by good machineability, good mechanical properties and good thermal conductivity in conjunction with comparatively low costs. The disadvantage of most metal materials is their high coefficient of thermal expansion in comparison with conventional semiconductor materials and, in this context, their electrical conductivity.

If it is assumed that the housing is manufactured from metal materials, the transition from the low coefficient of thermal expansion of the semiconductor materials of the luminescence diode chip to the high coefficient of thermal expansion of the metal housing materials must be implemented at some point along the heat path. Connections with high thermal conductivity between materials can be realized in particular by soldering and sintering methods. Such connections are mechanically very rigid. Therefore, in the case of a difference in the coefficient of expansion, forces are built up on the joint surface. These forces in turn can result in damage or destruction of the composite at the joint surface or of the weaker partner in the joint. The robustness of a connection including joint partners with a coefficient of expansion which is not matched changes with the size of the joint surface. Joint surfaces with a large amount of mechanical expansion are more difficult to control than small joint surfaces. For this reason, it is favorable to implement the transition in the heat path from the low coefficient of expansion of a semiconductor material (for example: germanium 5.8 ppm/K) to the higher coefficient of expansion of a metal material (for example: aluminum 23 ppm/K) in a region with small structural sizes.

A further problem consists in the flat fitting of a number of individual chips. If the individual luminescence diode chips are mounted on a metal mount, the mounting faces of all of the luminescence diode chips are at a common electrical potential. This design corresponds to a parallel circuit. If the individual luminescence diode chips have differences in the U/I characteristics, the circuit layout results in overenergization of the luminescence diode chips with a low forward voltage. A further disadvantage of this luminescence diode chip arrangement can be the ratio of current to voltage. Parallel circuits have fundamentally high operating currents given a low forward voltage. This can result in increased driver costs and/or lower driver efficiency. The possibility of implementing parallel circuits and series circuits is advantageous here.

It has therefore been identified that a design in which the luminescence diode chips are mounted on a circuitry plane which is applied to a further electrically insulating but thermally conductive layer can be advantageous. The electrically insulating layer can then intercede between the low coefficient of expansion of the semiconductor material and the high coefficient of expansion of the heat sink and the housing.

Until now, various solutions have been in widespread use:

A) Luminescence diode chips on metal-core printed circuit board (MCPCB). This approach represents a simple solution. The rear side of the MCPCB is electrically insulated. The MCPCB is usually based on an aluminum sheet which can be mounted comparatively easily. The circuitry plane can be structured, with the result that different circuitry variants can be produced with certain restrictions. The insulating layer has a certain elasticity, and therefore different coefficients of expansion between the semiconductor and the aluminum of the base plate are sufficiently well compensated for for many applications. The weak point of this solution consists in the restricted thermal conductivity of the insulation layer (3 W/mK at a thickness of d=38 μm).

B) DCB (direct copper bonding). In the DCB process, thin copper sheets are joined under pressure and temperature with ceramic plates ($Al_2O_3$, AlN). Owing to the comparatively thin copper and ceramic layers, stresses can be absorbed by elastic deformation. Thus, differences in coefficients of expansion between the semiconductor and the housing can be partially compensated for. One disadvantage of this variant consists in that the structuring of the circuitry plane is implemented by photo technology in conjunction with etching. It is thus difficult to fall below minimum dimensions determined by cost.

C) Ceramic substrate. Given this design, ceramics are metal-plated on one or both sides. The design of luminescence diode chips (low coefficient of expansion) on the metal-plated ceramic (low coefficient of expansion) is possible without any problems. The difficulties begin when fitting the ceramic module in a metallic housing. If the ceramic module is soldered into the housing, for example, good heat dissipation can be achieved. Owing to the high level of mechanical rigidity of the soldered joint, however, forces are built up which can result in destruction of the joint or ceramic substrate.

A lighting device in which the second mount is at least partially severed into at least two parts after the fastening on the first mount is technically more difficult to produce than when there is no such severing. The substantial disadvantage of a lighting device in which this severing does not take place, however, consists in the low durability of the lighting device in the case of alternating thermal stress owing to the thermal expansion of the second mount in a lateral direction, parallel to the surface of the first mount on which the second mount is applied, and owing to the considerable difference in the coefficient of thermal expansion between the first mount and the second mount.

In the method described here, the second mount can now be separated into smaller segments, the parts of the second mount, after the fastening on the first mount. The distance between the parts of the second mount is then merely determined by the material erosion which is produced by the severing. That is to say that the parts of the second mount have a particularly small distance from one another, as could not be achieved by virtue of the parts of the second mount being mounted individually on the first mount. In the region of these small distances and owing to the small lateral expansion of the parts of the second mount, the difference in the coefficient of thermal expansion between the second mount and the first mount can be controlled by virtue of the fact that the forces produced can be absorbed by elastic deformation without material-specific limit values for the destruction being exceeded. A suitable method for at least partially severing the second mount can be, for example, one of the following methods or combinations of several of the following methods: mechanical sawing, abrasive cutting, laser cutting methods, ion etching methods, chemical cutting methods.

The connections between the first mount and the second mount and between the parts of the second mount and the luminescence diode chips can be produced by sintering methods and/or soldering methods. As a result, connections with good thermal conductivity and high strength are realized. The second mount can in particular be designed to be electrically insulating, with the result that it forms an electrically potential-free heat sink. In particular ceramic materials such as AlN or $Al_2O_3$ are suitable for this. The first mount is in particular metallic and can thus be integrated easily in a housing for the lighting device, for example.

In accordance with at least one embodiment of the method, prior to the severing of the second mount, a first structured metal layer is applied to that surface of the second mount which is remote from the first mount, wherein regions of the first structured metal layer are separated from one another by at least one trench, along which the severing of the second mount into the at least two parts takes place. That is to say that, by virtue of the first structured metal layer on that upper side of the second mount which is remote from the first mount, the second mount is severed into its parts in accordance with the pattern, as prescribed by the trenches between the regions of the first structured metal layer. By virtue of the structuring of this metal layer, in addition series circuits and/or parallel circuits between the luminescence diode chips of the lighting device can be realized when the structured metal layer is electrically conductively connected to the luminescence diode chips. That is to say that the luminescence diode chips can in particular be electrically conductively connected at the first structured metal layer. The soldered joints and/or the sintered joints between the first mount and the second mount and the luminescence diode chips are in this case selected in respect of their softening points in such a way that in each case the first joint produced has the highest softening point and the last joint produced has the lowest softening point in the process chain. In this way, it is ensured that no damage or even detachment of already produced connections can take place as a result of a subsequent connection being made.

In accordance with at least one embodiment of the method, prior to fastening of the second mount to the first mount, a structured connecting layer is arranged between the first mount and the second mount, said connecting layer being at least partially congruent with the first structured metal layer within manufacturing tolerances.

The structured connecting layer is, for example, a hard solder layer. The structured connecting layer is applied in such a way that it likewise has trenches between the regions of the structured connecting layer which are congruent with the trenches in the opposite upper side of the second mount, i.e. the trenches in the first structured metal layer. It is thus possible that no cutting of the connecting layer needs to take place when severing the second mount into its parts along the trenches of the first structured metal layer. Instead, after the severing, each region of the connecting layer which is already present prior to the severing is uniquely associated with a part of the second mount and mechanically fastened thereto. That is to say that the mechanical decoupling of the parts of the second mount also extends to the connecting layer between the first mount and the second mount.

It is alternatively possible for the connecting layer between the first mount and the second mount to be implemented over the full area on the lower side of the second mount which faces the first mount. In this case, during severing of the second mount into its parts, the connecting layer is also cut as well. In this case, however, it may be necessary to change the cutting method after severing of the second mount. For example, it may be necessary to replace a saw blade which is suitable for severing ceramic material with a saw blade which is suitable for severing the in particular metal connecting layer once the second mount has been severed. As a result, additional process engineering complexity may be involved.

In accordance with at least one embodiment of the method prior to the fastening of the second mount on the first mount, a second structured metal layer is applied to that surface of the second mount which faces the first mount, said second structured metal layer being congruent with the first structured metal layer within manufacturing tolerances. The second structured metal layer serves in particular to produce a connection between the second mount and the connecting layer. The second structured metal layer is applied to the second mount in such a way that it is not cut into its parts during severing of the second mount, but the cutting takes place by means of trenches in the second structured metal layer which are congruent with the trenches in the first structured metal layer.

The first and second structured metal layers can be designed identically. That is to say that the two metal layers are formed with the same materials, have the same layer structure and are applied in the same pattern to both sides of the second mount. For example, they are applied by coating methods such as sputtering, vapor deposition, electroless plating and/or galvanic plating on the upper side and the lower side of the second mount. For example, the structured metal layers can be formed with metals such as gold, copper, nickel and/or chromium.

In accordance with at least one embodiment of the method, the thickness of the at least one trench in the first structured metal layer is at most 150 µm. The distance between the parts of the second mount which are produced by the severing is then determined by the thickness of the trench between them, i.e. it is at most 150 µm. In particular, the distance between the parts is then lower since, preferably, a thinner region is selected for the severing, in which the material erosion takes place, in order not to damage the structured metal layer during severing.

Furthermore, a lighting device is specified. The lighting device can be produced in particular with a method described here. That is say that all of the features disclosed for the method are also disclosed for the lighting device, and vice versa.

In accordance with at least one embodiment of the lighting device, the lighting device includes a first mount and a second mount, which is fastened on the first mount, and at least two luminescence diode chips, which are fastened on that side of the second mount which is remote from the first mount. The mounts and the luminescence diode chips are in this case in particular designed as specified further above.

The second mount includes at least two parts, which are separated from one another by at least one separating region, which extends partially or completely through the second mount.

That is to say that the two parts of the second mount are not mechanically connected to one another by material of the second mount, for example, but a mechanical connection between the parts of the second mount is merely produced by the first mount, for example.

In addition, it is possible for the two parts to be separated from one another by a desired breaking point, as is described further above. During operation of the lighting device, complete separation of the two parts may then arise, as a result of which thermal stresses are reduced.

The at least two parts of the second mount in this case have a distance of at most 125 µm from one another. That is to say that the two parts of the mount are arranged particularly close to one another, wherein the distance between the parts is so small that it can barely be realized or can only be realized with a very high degree of adjustment complexity as a result of the parts of the second mount being applied to the first mount separately.

In accordance with at least one embodiment of the lighting device, the two parts each have traces of a separating process on mutually facing side faces. The side faces are parts of the outer face of the parts of the second mount which run at an angle to or perpendicular to the lateral direction. They are produced in particular by an above-described severing method and have recesses such as sawn grooves from this separating process, for example. The traces of the separating process are therefore in particular traces of material erosion and not broken edges, for example.

In accordance with at least one embodiment of the lighting device, each part of the second mount has a region of a first structured metal layer on its surface remote from the first mount, wherein each region is uniquely associated with a part of the second mount, and at least two of the regions of the first structured metal layer are electrically conductively connected to one another by a connecting wire. In other words, the structured metal layer does not extend over the parts of the second mount, but each part of the second mount includes a region of the structured metal layer which is associated uniquely with it. By means of connecting at least two regions of the structured metal layer, i.e. regions on different parts of the second mount, by means of an electrical connecting element such as a connecting wire, particularly flexible interconnection of the luminescence diodes of the lighting device can take place.

In accordance with at least one embodiment of the lighting device, two luminescence diode chips, which are connected in series with one another by the region of the first structured metal layer, are applied to at least one of the regions of the first structured metal layer. In this case, a first of the luminescence diode chips is applied with its p side, for example, onto the region, and another of the luminescence diode chips is applied with its n side to the region. In this case, therefore, a part of the second mount supports at least two luminescence diode chips.

In accordance with at least one embodiment of the lighting device, the second mount is arranged at an edge and/or in a corner of the first mount, wherein an electrical connecting means for electrically connecting all of the luminescence diode chips which are arranged on the second mount in places runs along and on that surface of the first mount which is associated with the second mount.

In this case, at least one side face of the second mount can terminate flush with at least one side face of the first mount, for example. In particular, the second mount is then not arranged in a central region of the first mount, but at the edge of said first mount, with the result that a relatively large part of the surface of the first mount which faces the second mount can act as a mechanical element for supporting the connecting means via which the luminescence diode chips of the lighting device are electrically connected. The connecting means is, for example, a flexible printed circuit board and/or a printed circuit board which is fastened on the mentioned surface of the first mount.

Also specified is an arrangement of lighting devices. The arrangement of lighting devices includes at least two lighting devices as described here, in which the second mount is arranged at an edge or in a corner of the first mount. The second mounts of the lighting devices are then arranged next to one another in such a way that the luminescence diode chips which are arranged on the second mounts form a common light-emitting area. In particular, it is barely perceivable to the naked eye of a human observer that the luminescence diode chips are associated with different first and second mounts. Instead, the luminescence diode chips of the at least two lighting devices can then appear to be in the form of a regular arrangement in rows and columns, for example.

This is the case in particular when the second mounts of two different lighting devices have a distance of at most 125 µm from one another. That is to say that the distance between the luminescence diode chips of two different lighting devices of the arrangement of lighting devices is then approximately or precisely as great as the distance between the luminescence diode chips within one of the lighting devices in the region of the edge or the corner. Such a precise adjustment is enabled in particular by virtue of the fact that relatively large components are positioned with respect to one another with the first mounts of the lighting device, said components having a substantially greater lateral extent than those parts of the second mount which are produced by the severing.

BRIEF DESCRIPTION OF THE DRAWINGS

In the drawings, like reference characters generally refer to the same parts throughout the different views. The drawings are not necessarily to scale, emphasis instead generally being replaced upon illustrating the principles of the disclosure. In the following description, various embodiments of the disclosure are described with reference to the following drawings, in which.

DETAILED DESCRIPTION

The following detailed description refers to the accompanying drawings that show, by way of illustration, specific details and embodiments in which the disclosure may be practiced.

Figure 1:
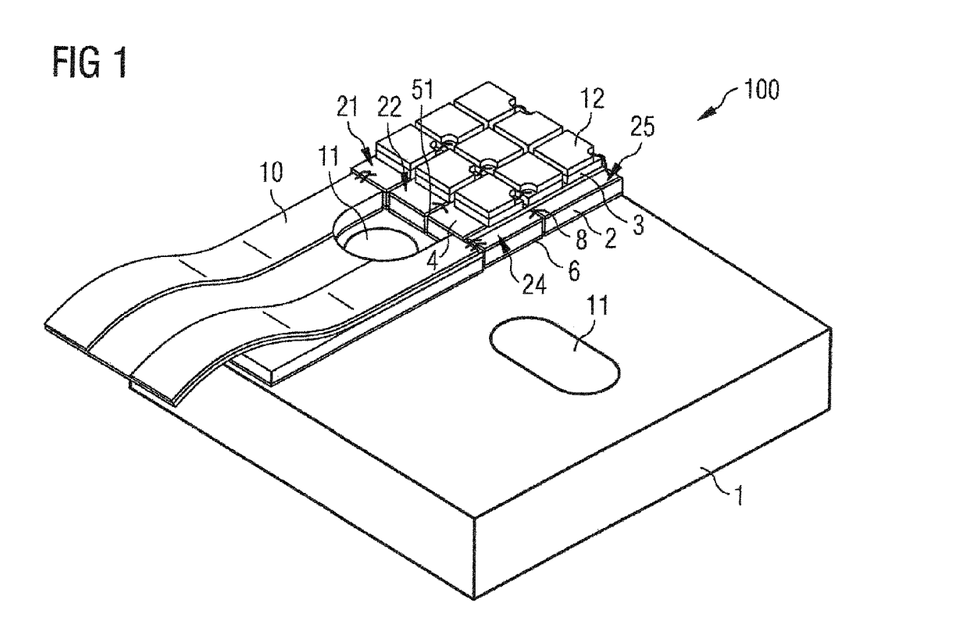
FIG. 1 shows an embodiment of a lighting device using the schematic perspective illustration.

FIG. 1 shows a lighting device described here in a schematic perspective illustration.

The lighting device includes a first mount 1. In this case, the first mount 1 may be a metal mount, in particular a heat sink consisting of copper. The metal mount 1 includes openings 11, via which the mount 1 can be fastened mechanically, for example using dowel pins and screws, at the intended location for the lighting device.

The second mount 2, which is severed into a plurality of parts 21 to 28, is arranged on an upper side of the first mount 1.

A structured connecting layer 6 is arranged between the first mount 1 and the second mount 2, wherein each region of the structured connecting layer 6 is uniquely associated with each part of the second mount 2.

In this case nine luminescence diode chips are applied to the parts of the second mount 2 and electrically interconnected with one another by means of connecting wires 8 on that upper side of the second mount 2 which is remote from the first mount.

Each luminescence diode chip 3 includes, on its upper side remote from the second mount 2, a layer consisting of a converter 12, which is designed for the down-conversion of electromagnetic radiation and is used, for example, for producing white light.

The second mount 2 is in this case designed to be electrically insulating and ceramic. It consists of AlN or $Al_2O_3$, for example.

The parts 21 to 28 of the second mount 2 are separated from one another by separating regions 51. These separating regions 51 are free of the material of the second mount 2. Side faces 2a of those parts of the second mount 2 which face one another (see also in this regard FIG. 2E) have traces of the cutting process used to produce the parts 21 to 28 of the second mount.

In this case, the second mount 2 is arranged in a corner of the first mount 1 in such a way that two side faces of the second mount on the outer face of the second mount terminate flush with two side faces on the outer face of the first mount, within manufacturing tolerances.

An electrical connecting means 10, in this case a printed circuit board, onto which a flexible printed circuit board such as a flexboard, for example, is applied, runs along the upper side of the first mount 1. All of the luminescence diode chips 3 of the lighting device are electrically connected by means of the electrical connecting means 10.

A lighting device described here has, for example, a forward voltage of at least 30 V, for example 35 V. In addition, a lighting device 100 described here has, for example, a forward current of at least 0.8 A, for example 1 A. The luminous flux can be greater than 3000 lm, in particular greater than 3200 lm, and the illuminance can be more than 250 $lm/mm^2$, for example 290 $lm/mm^2$. The heat generated during operation can in this case be dissipated particularly effectively by the combination of the severed second mount and the first mount without thermal alternating stress resulting in damage to the lighting device 100.

The schematic illustrations in FIGS. 2A to 2F show method steps of an embodiment of a method described here for producing a lighting device 100.

Figure 2A:
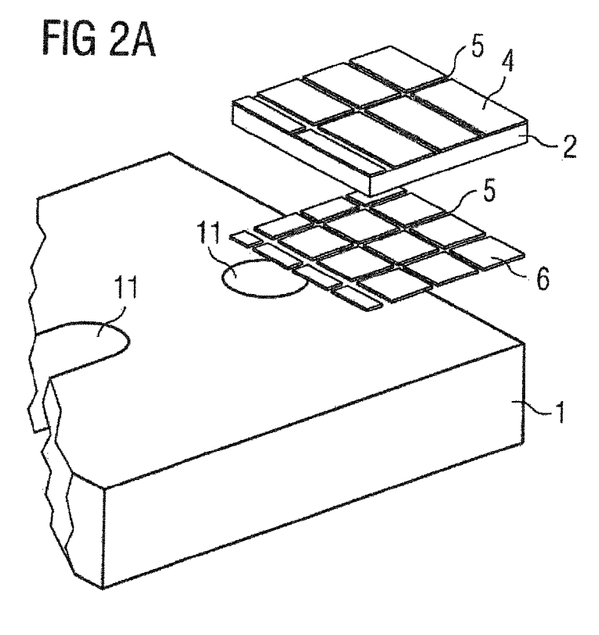
FIGS. 2A to 2F show an embodiment of a method using the schematic illustrations.

In conjunction with FIG. 2A, a method step is explained in more detail, in which the first mount 1 is provided. A structured connecting layer 6 is applied to the upper side of the first mount 1. The structured connecting layer 6 is structured in mutually separate regions, which are congruent with a second structured metal layer 7 on the lower side of the second mount 2 facing the first mount (cf. in this regard FIG. 2B). By virtue of the fact that the structured metal layer and the structured connecting layer are structured identically, when the second mount 2 is applied to the first mount 1 and fastened by means of the structured connecting layer 6, self-adjustment of the second mount 2 on the first mount 1 takes place.

Figure 2B:
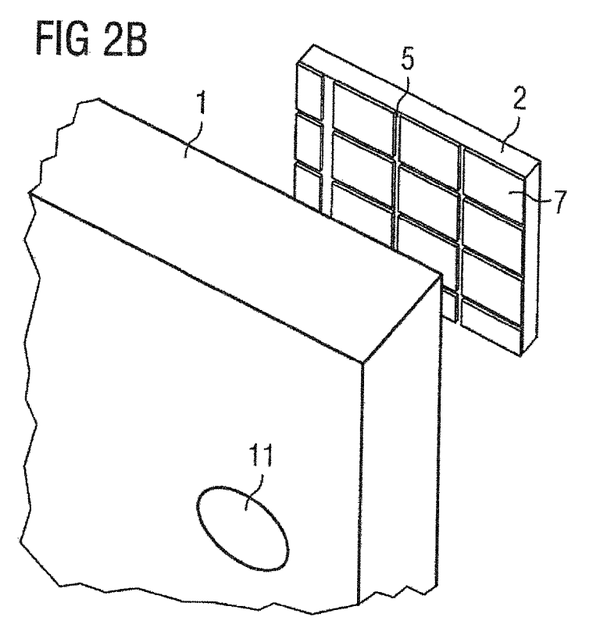

The second mount 2 has a first structured metal layer 4 on its upper side remote from the first mount 1, which first structured metal layer 4 is in places congruent with the structured connecting layer 6 and the second structured metal layer 7. In particular, trenches 5 between regions of the first structured metal layer 4 correspond to trenches 5 between regions of the structured connecting layer 6 or between regions of the second structured metal layer 7.

That is to say that, in particular in the region of the subsequent separating regions 51 between the parts 21 to 28 of the second mount 2, trenches 5 are located in all of the structured layers.

Figure 2C:
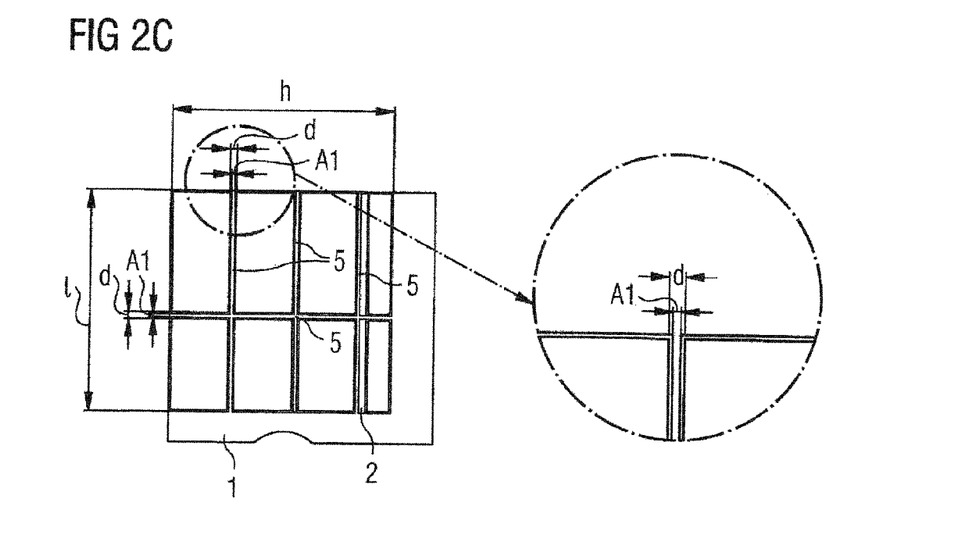

In FIG. 2C, exemplary values for the length l, the width b of the second mount 2 are provided. In addition, exemplary values for the thickness of the trenches 5 and the distance Al between adjacent parts of the second mount are specified. In particular, the thickness of the trench 5 between adjacent regions of the first structured metal layer 4 can be 100 μm or less. The separating region 51 which runs along the trench 5 then has a thickness A1 which determines the later distance between the parts 21 to 28 of the second mount 2 and which is smaller than the thickness d of the trenches 5.

Figure 2D:
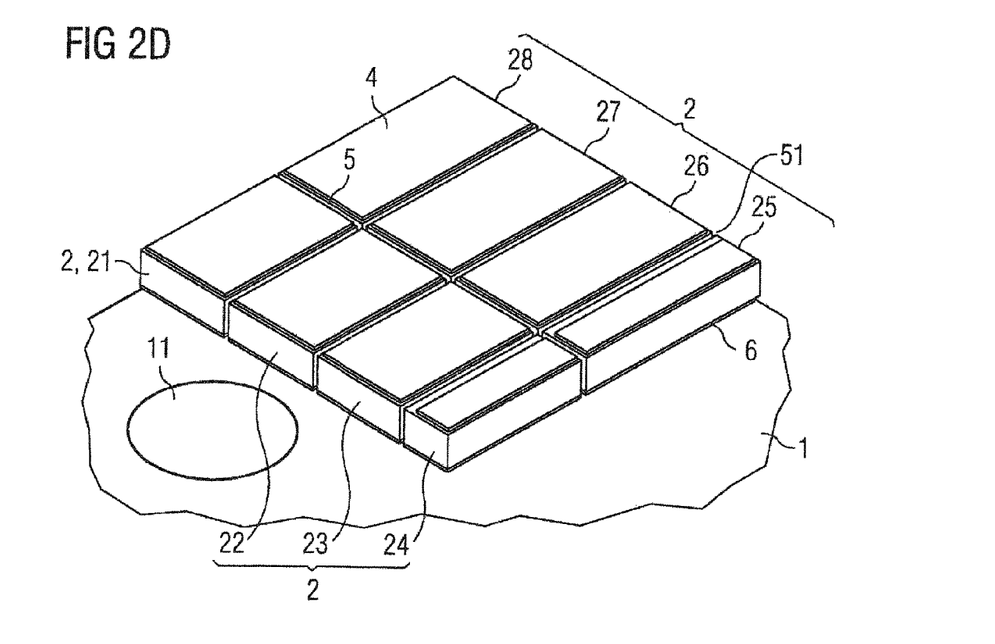

FIG. 2D illustrates the design after severing of the second mount 2 into the regions 21 to 28. That is to say that separating regions 51 which have the thickness A1 are arranged between the parts 21 to 28 of the second mount 2 along the trenches 5 between the regions of the first structured metal layer 4. Severing of the second mount 2 can in this case take place as described above.

The parts 21 to 28 of the second mount 2 are in this case connected to the first mount 1 by the structured connecting layer 6, i.e. in particular by a soldered joint. As a result, a connection with a particularly low thermal resistance is produced. The coefficient of thermal expansion of copper is over three times as great as the coefficient of thermal expansion of AlN. This large difference in the coefficients of thermal expansion can be compensated for by the severing of the second mount 2 into relatively small parts 2, which are arranged very close to one another.

Figure 2E:
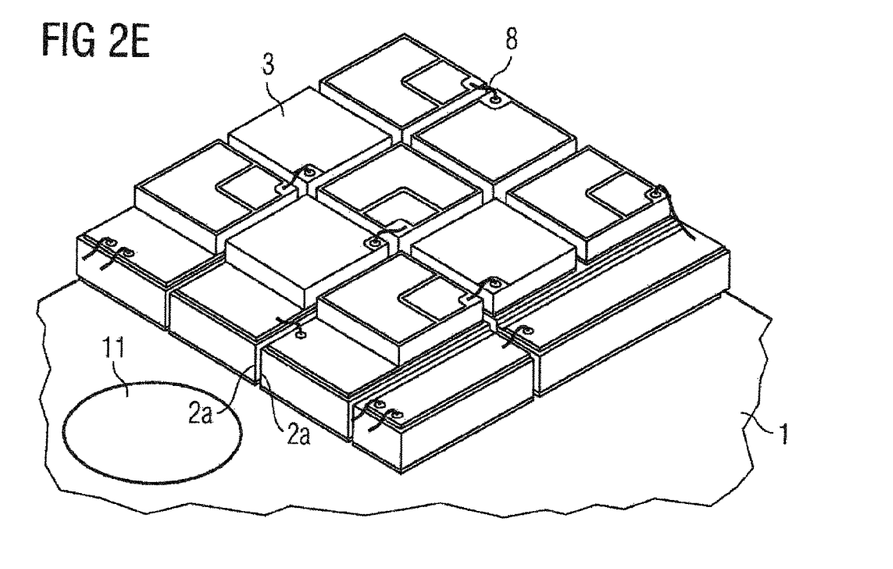

In a subsequent method step, FIG. 2E, luminescence diode chips 3 are fastened on that upper side of the second mount 2 which is remote from the first mount 1. Interconnecting the luminescence diode chips can in this case be performed by suitable mounting and/or interconnection by means of connecting wires 8. In this case, the luminescence diode chips 3 are connected in series with one another, wherein the parts 26, 27 and 28 with their uniquely associated regions of the structured metal layer 4 each connect two luminescence diode chips in series, which luminescence diode chips are each fastened on the second mount 2 with a different orientation.

Figure 2F:
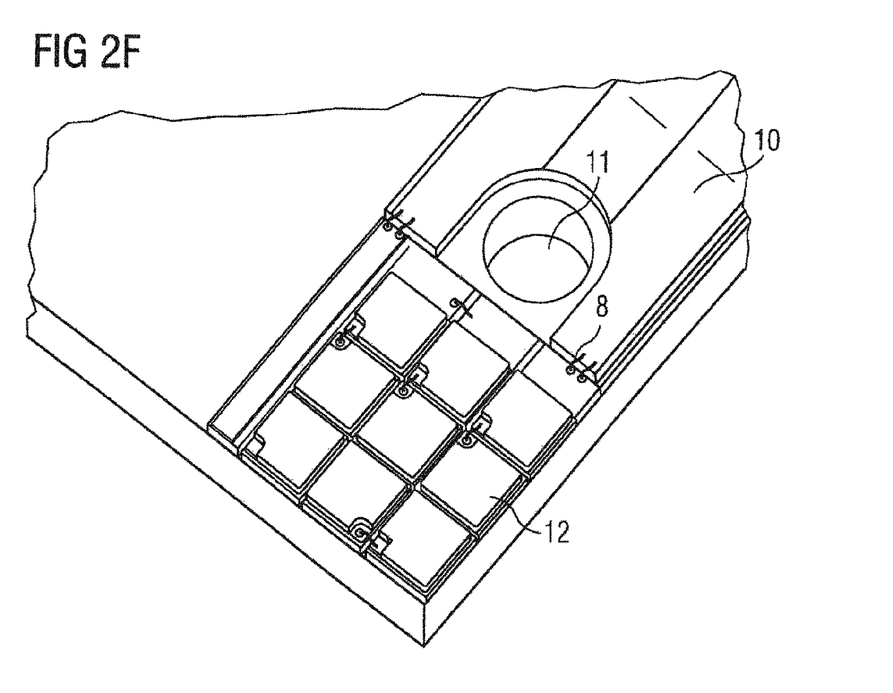

In a subsequent method step, see FIG. 2F, the electrical connecting means 10 can be electrically conductively connected to the luminescence diode chips 3. This can be performed, for example, via connecting wires 8, which are connected to the electrical connecting means 10 and the first structured metal layer 4.

As is illustrated in FIG. 2F, the luminescence diode chips 3 may each include a layer with a converter 12, which may be applied to the second mount 2 prior to or after the application of the luminescence diode chips 2. The luminescence diode chips 2 are thus suitable for producing white light, for example.

Figure 3:
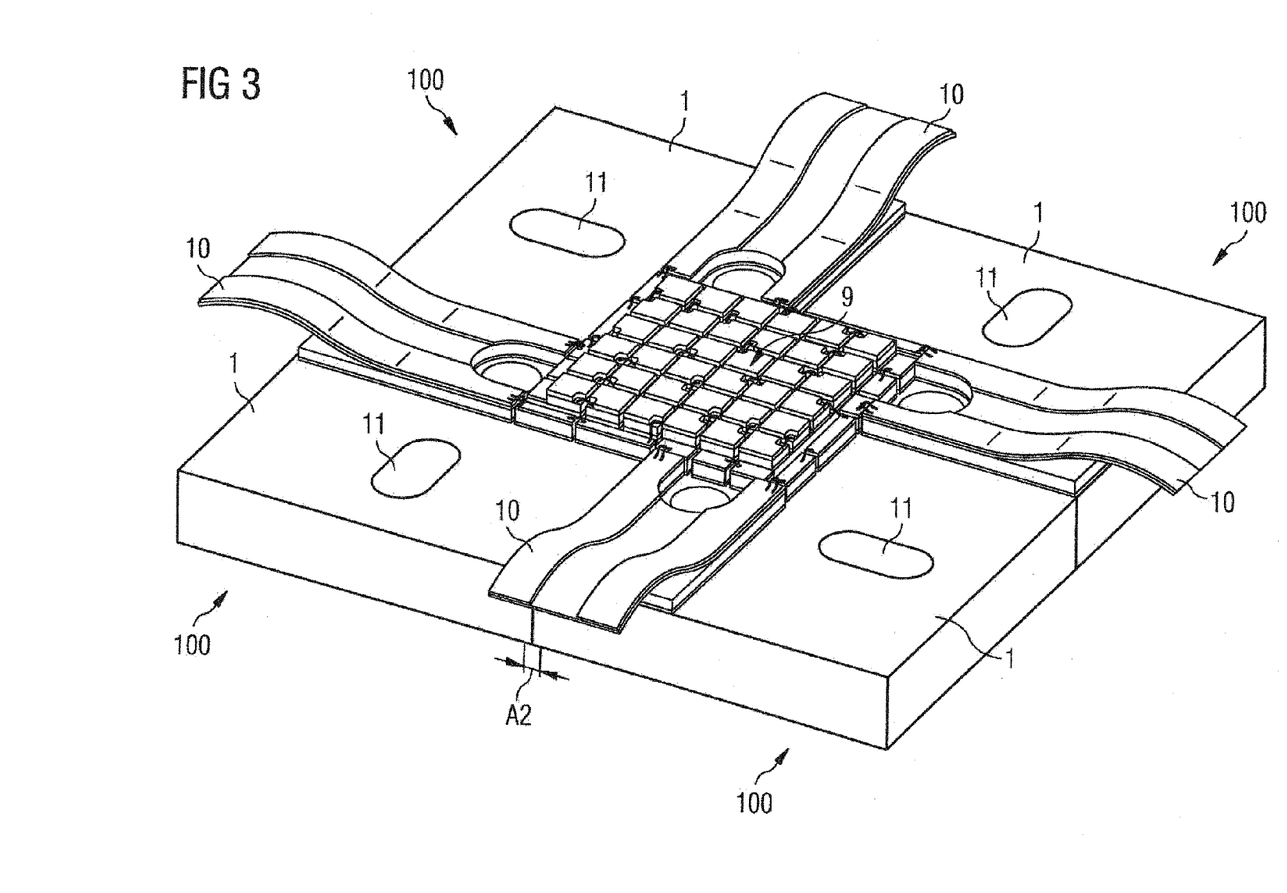
FIG. 3 shows an arrangement of lighting devices using the schematic perspective illustration.

In conjunction with FIG. 3, an arrangement of lighting devices 100 described here is explained in more detail using a schematic perspective illustration. The arrangement includes four lighting devices 100, in which the second mount 2 is arranged in each case in a corner of the first mount 1. The individual lighting devices 100 are adjusted with respect to one another in such a way that a common light-emitting area 9 of all of the luminescence diode chips of the four lighting devices 100 is produced, on which the luminescence diode chips 3 are arranged in rows and columns. The adjustment can be performed in this case by means of the openings 11 in the first mount 1.

In addition to the geometry shown, long lines of luminescence diode chips can thus also be arranged next to one another in a row, for example. The luminescence diode chips 3 of a lighting device 100 can in this case be operated independently of the luminescence diode chips 3 of another lighting device 100.

That is to say that a lighting device described here also enables scaling of the light-emitting area 9 in a particularly simple manner. Thus, for example, a linear arrangement of lighting devices 100 can be specified which includes an individual row of luminescence diode chips arranged tightly next to one another in a row.

A lighting device 100 described here and the arrangement 100 described here can in this case be characterized by way of summary in particular by at least one of the following advantages:

1) Good thermal conductivity. By virtue of the use of soldering or sintering methods at the joint surfaces, very good thermal transfer is achieved. By virtue of the use of materials with good thermal conductivity, good dissipation of heat is achieved.

2) Potential-free heat sink. By virtue of the use of a ceramic mount, the heat sink is kept free of electrical potential.

3) The metal-plating of the ceramic mount can be structured. Thus, when designing multi-chip modules, series circuits, parallel circuits or matrix circuits can be implemented.

4) By virtue of the separation of the ceramic mount into small islands, the transition from the low coefficient of expansion (semiconductor) to the high coefficient of expansion (metal) is realized with small structures. Forces which are caused by the unmatched coefficients of expansion do not exceed critical loading thresholds for the processed materials. By virtue of the separation of the second mount after it has been mounted on the first mount into small islands, a very robust substrate is produced in respect of thermal alternating stress.

5) Costs. For the substrate described in the disclosure, i.e. the proposed combination of the first and second mounts, materials and processes which are commercially available comparatively inexpensively are used. This results in a robust substrate material at comparatively low cost.

The disclosure is not restricted to the exemplary embodiments by the description of these exemplary embodiments. Instead, the disclosure includes any novel feature and any combination of features which in particular contains any combination of features in the patent claims, even if this feature or this combination is itself not explicitly specified in the patent claims or exemplary embodiments.

The invention claimed is:

1. A method for producing a lighting device, the method comprising:
   providing a first mount,
   fastening a second mount to the first mount,
   at least partially severing the second mount into at least two parts after fastening of the second mount to the first mount,
   wherein prior to the severing of the second mount, a first structured metal layer is applied to that surface of the second mount which is remote from the first mount, wherein regions of the first structured metal layer are separated from one another by at least one trench, along which the severing of the second mount into the at least two parts takes place, and at least two of the regions of the first structured metal layer are electrically conductively connected to one another by a connecting wire, and
   fastening at least two luminescence diode chips to that side of the second mount which is remote from the first mount, wherein at least two of the luminescence diode chips are fitted on different parts of the second mount and each luminescence diode chip is arranged at only one part of the second mount.

2. The method as claimed in claim 1,
   wherein prior to fastening of the second mount to the first mount, a structured connecting layer is arranged between the first mount and the second mount, said connecting layer being congruent with the first structured metal layer within manufacturing tolerances.

3. The method as claimed in claim 1,
   wherein prior to the fastening of the second mount on the first mount, a second structured metal layer is applied to that surface of the second mount which faces the first mount, said second structured metal layer being congruent with the first structured metal layer within manufacturing tolerances.

4. The method as claimed in claim 1,
   wherein the thickness of the at least one trench is at most 150 μm.

5. The method as claimed in claim 2,
   wherein prior to the fastening of the second mount on the first mount, a second structured metal layer is applied to that surface of the second mount which faces the first mount, said second structured metal layer being congruent with the first structured metal layer within manufacturing tolerances.

6. A lighting device comprising
   a first mount,
   a second mount, which is fastened on the first mount,
   at least two luminescence diode chips, which are fastened on that side of the second mount which is remote from the first mount, wherein
   the second mount comprises at least two parts, which are separated from one another by at least one separating region, which extends at least partially through the second mount, and
   the at least two parts of the second mount have a distance of at most 125 μm from one another, wherein
   a first structured metal layer is applied to that surface of the second mount which is remote from the first mount, wherein regions of the first structured metal layer are separated from one another by at least one trench, and wherein
   a second structured metal layer is applied to that surface of the second mount which faces the first mount, said second structured metal layer being congruent with the first structured metal layer within manufacturing tolerances.

7. The lighting device as claimed in claim 6, in which the two parts each have traces of a separating process on mutually facing side faces.

8. The lighting device as claimed in claim 6, in which each part of the second mount has a region of a first structured metal layer on its surface remote from the first mount, wherein each region is uniquely associated with a part of the second mount, and at least two of the regions of the first structured metal layer are electrically conductively connected to one another by a connecting wire.

9. The lighting device as claimed in claim 6, in which each part of the second mount has a region of a first structured metal layer on its surface remote from the first mount, wherein each region is uniquely associated with a part of the second mount, and two luminescence diode chips are applied to at least one of the regions of the first structured metal layer, said luminescence diode chips being connected in series by the region.

10. The lighting device as claimed in claim 6, in which the second mount is arranged at an edge and/or in a corner of the first mount, wherein an electrical connecting means for electrically connecting all of the luminescence diode chips which are arranged on the second mount in places runs along and on that surface of the first mount which is associated with the second mount.

11. An arrangement of a lighting device comprising: at least two lighting devices as claimed in claim 6 wherein the second mounts of the lighting devices are arranged adjacent to one another in such a way that the luminescence diode chips which are arranged on the second mounts form a common light-emitting area.

12. A method for producing a lighting device comprising the following steps: providing a first mount, fastening a second mount to the first mount, at least partially severing the second mount into at least two parts after fastening of the second mount to the first mount, and fastening at least two luminescence diode chips to that side of the second mount which is remote from the first mount, wherein, prior to the severing of the second mount, a first structured metal layer is applied to that surface of the second mount which is remote from the first mount, wherein regions of the first structured metal layer are separated from one another by at least one trench, along which the severing of the second mount into the at least two parts takes place, and prior to the fastening of the second mount on the first mount, a second structured metal layer is applied to that surface of the second mount which faces the first mount, said second structured metal layer being congruent with the first structured metal layer within manufacturing tolerances.

13. The method as claimed in claim 12, wherein at least two of the luminescence diode chips are fitted on different parts of the second mount.

14. The method as claimed in claim 12, wherein the first mount is designed to be electrically conductive, and the second mount is designed to be electrically insulating.

15. The method as claimed in claim 12, wherein the first mount is metallic and the second mount is ceramic.

16. The method as claimed in claim 12, wherein prior to fastening of the second mount to the first mount, a structured connecting layer is arranged between the first mount and the second mount, said connecting layer being congruent with the first structured metal layer within manufacturing tolerances.

17. The method as claimed in claim 12, wherein the thickness of the at least one trench is at most 150 μm.

* * * * *